United States Patent
Yamamura (10) Patent No.: US 8,779,470 B2
(45) Date of Patent: Jul. 15, 2014

(54) SEMICONDUCTOR DEVICE

(71) Applicant: Kabushiki Kaisha Toshiba, Tokyo (JP)

(72) Inventor: Takuji Yamamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/777,048

(22) Filed: Feb. 26, 2013

(65) Prior Publication Data

US 2013/0228790 A1   Sep. 5, 2013

(30) Foreign Application Priority Data

Mar. 2, 2012   (JP) ................. 2012-046442

(51) Int. Cl.
- *H01L 31/0328* (2006.01)
- *H01L 31/0336* (2006.01)
- *H01L 31/072* (2012.01)
- *H01L 31/109* (2006.01)

(52) U.S. Cl.
USPC .................. 257/192; 257/194; 257/E29.246; 257/E29.247

(58) Field of Classification Search
USPC ....... 257/20, 24, 192, 194, E29.246, E29.247
See application file for complete search history.

(56) References Cited

U.S. PATENT DOCUMENTS

| | | | |
|---|---|---|---|
| 7,235,845 B2 * | 6/2007 | Xu et al. ........................ | 257/343 |
| 2006/0006415 A1 | 1/2006 | Wu et al. | |

FOREIGN PATENT DOCUMENTS

| | | |
|---|---|---|
| JP | 11-168099 | 6/1999 |
| JP | 2006-286952 | 10/2006 |
| JP | 2007-537593 | 12/2007 |
| JP | 2012-33690 | 2/2012 |

OTHER PUBLICATIONS

K. Asano et al. " Novel High Power AlGaAs/GaAs HFET with a Field-Modulating Plate Operated at 35V Drain Voltage", IEDM Technical Digest, IEEE 1998, pp. 59-62.
Y.F. Wu et al. "30-W/mm GaN HEMTs by Field Plate Optimization", IEEE Electron Device Letters, vol. 25, No. 3, Mar. 2004, pp. 117-119.
Huili Xing et al. " High Breakdown Voltage AlGaN-GaN HEMTs Achieved by Multiple Field Plates", IEEE Electron Device Letters, vol. 25, No. 4, Apr. 2004, pp. 161-163.
Office Action issued Jan. 28, 2014 in Japanese Patent Application No. 2012-046442 (with English translation).
U.S. Appl. No. 14/018,775, filed Sep. 5, 2013, Yamamura.

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

A semiconductor device, comprising: a substrate; a plurality of gate finger electrodes which are arranged on the substrate; a plurality of source finger electrodes which are arranged on the substrate, each source finger electrode is close to the gate finger electrode; a plurality of drain finger electrodes which are arranged on the substrate, each drain finger electrode faces the source finger electrode via the gate finger electrode; a shield plate electrode which is arranged via an insulating layer over the drain finger electrode and the first surface of the substrate between the gate finger electrode and the drain finger electrode, is short-circuited to the source finger electrode, and shields electrically the gate finger electrode and the drain finger electrode from each other; and a slot VIA hole which is formed in the substrate under the source finger electrode and is connected to the source finger electrode.

10 Claims, 10 Drawing Sheets

SEMICONDUCTOR DEVICE

CROSS-REFERENCE TO RELATED APPLICATION

This application is based upon and claims the benefit of priority from the prior Japanese Patent Application No. 2012-046442, filed on Mar. 2, 2012, the entire contents of which are incorporated herein by reference.

FIELD

Embodiments of the present invention relate to a semiconductor device.

BACKGROUND

A source field plate is known as an electric field relaxation technique for a field effect transistor (FET). The source field plate arranged between a gate and a drain is capable of performing relaxation of electric field concentration near a gate electrode, and as a result, an FET improves a withstanding voltage thereof. In order to realize the relaxation of the electric field effectively, a source field plate is arranged near the gate electrode, or is arranged overlapping with the gate electrode.

As for an FET which operates at high frequency, such as a millimeter wave band, a high gain is expected when it operates at relatively low frequency, such as a microwave band etc. On the other hand, suppression of oscillation is difficult because feedback becomes large. Although the source field plate is effective in suppression of oscillation, the source field plate increases a capacitance Cgs between a gate and a source because the source field plate short-circuited to the source is arranged near the gate. As a result, gain of the FET decreases.

DETAILED EMBODIMENT

According to an embodiment, a semiconductor device includes: a substrate; a gate electrode which is arranged on a first surface of the substrate and has a plurality of gate finger electrodes; a source electrode which is arranged on the first surface of the substrate and has a plurality of source finger electrodes, the source finger electrode is close to the gate finger electrode; a drain electrode which is arranged on the first surface of the substrate and has a plurality of drain finger electrodes, the drain finger electrode faces the source finger electrode via the gate finger electrode; an insulating layer which covers the gate finger electrode, the substrate between the gate finger electrode and the source finger electrode, the substrate between the gate finger electrode and the drain finger electrode, at least a part of the source finger electrode, and at least a part of the drain finger electrode; a shield plate electrode which is arranged via the insulating layer over the drain finger electrode and the first surface of the substrate between the gate finger electrode and the drain finger electrode, is short-circuited to the source finger electrode, and shields electrically the gate finger electrode and the drain finger electrode from each other; a gate terminal electrode which is arranged on the first surface of the substrate and is connected to a plurality of the gate finger electrodes; a drain terminal electrode which is arranged on the first surface of the substrate and is connected to a plurality of the drain finger electrodes; a slot VIA hole which is formed in the substrate under the source finger electrode and is connected to the source finger electrode; and a shield plate short circuit line which connects the shield plate electrode and the source finger electrode.

Next, embodiments are described with reference to the drawings. In below, an explanation is simplified by giving the same numerals to the same elements and avoiding overlapping explanation of the same element. The drawings are schematic and you should care about that they differ from an actual thing. In addition, among the drawings, the portion from which the relation and ratio of a mutual size differ is contained.

The embodiments shown below illustrate devices and methods for materializing a technical idea, and the embodiments do not specify arrangement of each component part etc.

as followings. In these embodiments, various modifications may be made within claim coverage.

First Embodiment

Semiconductor Device

Figure 1A:
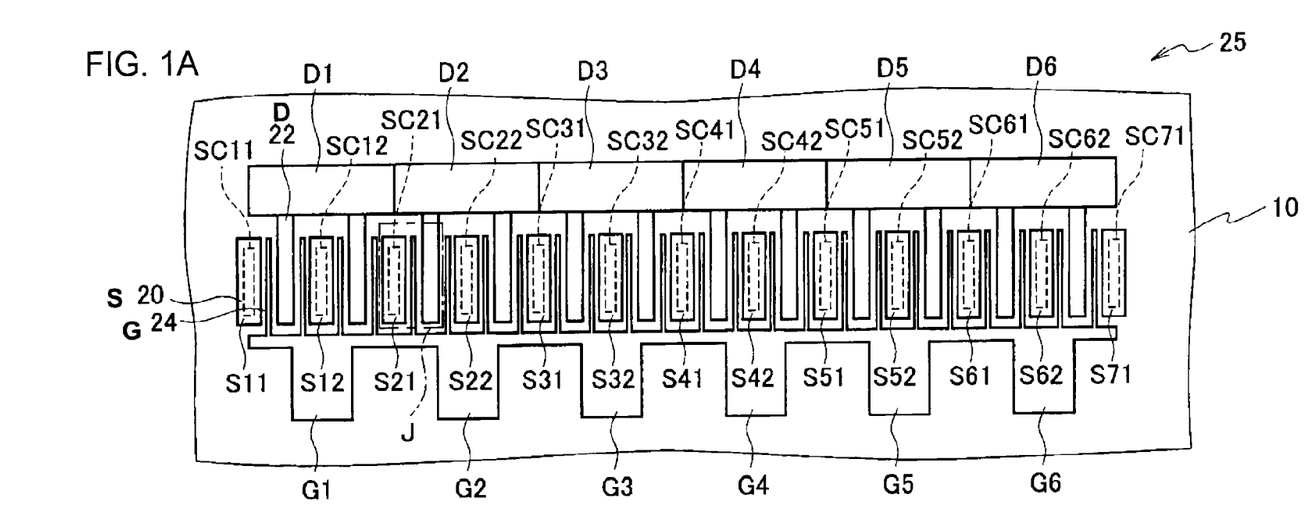
FIG. 1A shows a schematic plane pattern structure of a semiconductor device concerning a first embodiment.
Figure 1B:
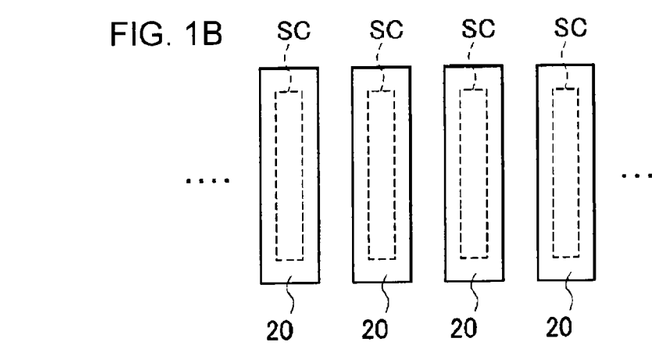
FIG. 1B shows an example of arrangement of slot VIAs and source electrodes.
Figure 1C:
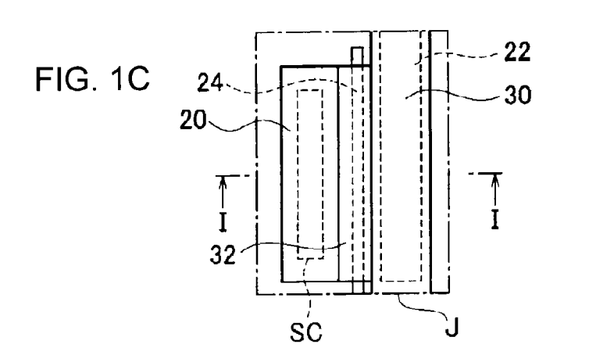
FIG. 1C shows a schematic plane pattern structure of J portion of FIG. 1A.
Figure 2:
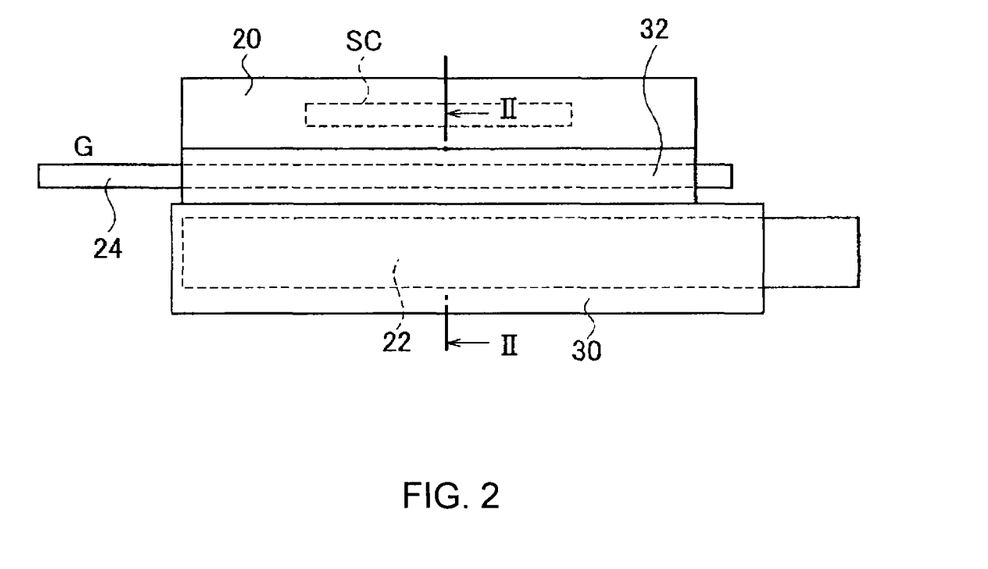
FIG. 2 shows a schematic plane pattern structure of a unit transistor portion in the semiconductor device concerning the first embodiment.
Figure 3:
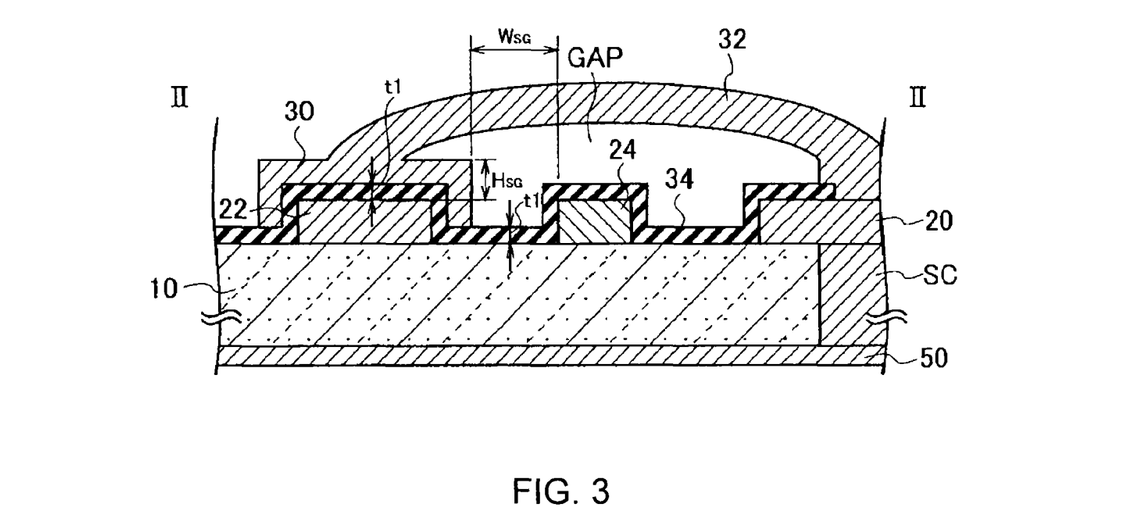
FIG. 3 shows a schematic cross section taken along a II-II line of FIG. 2.
Figure 4:
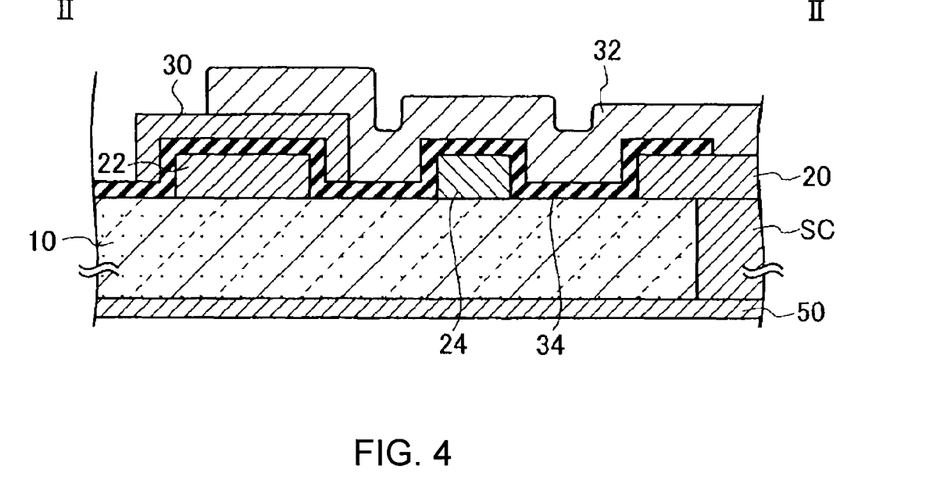
FIG. 4 shows another schematic cross section taken along the II-II line of FIG. 2.

FIG. 1A shows a schematic plane pattern structure of a semiconductor device 25 concerning the first embodiment. FIG. 1B shows an example of arrangement of slot VIA holes SC and source electrodes 20. FIG. 1 shows a schematic plane pattern structure of J portion of FIG. 1A. FIG. 2 shows a schematic plane pattern structure of a unit transistor portion in the semiconductor device 25 concerning the first embodiment, and FIG. 3 shows a schematic cross section taken along a II-II line of FIG. 2. FIG. 4 shows another schematic cross section taken along the II-II line of FIG. 2.

As shown in FIG. 1 to FIG. 4, the semiconductor device 25 concerning the first embodiment is provided with a substrate 10, a gate electrode G, a source electrode S, a drain electrode D, an insulating layer 34, shield plate electrodes 30, gate terminal electrodes G1, G2, ... , G6 and drain terminal electrodes D1, D2, ... , D6, slot VIA holes SC, SC11, SC12, SC21, SC22, ... , SC61, SC62, SC71 and shield plate short circuit lines 32.

The gate electrode D is arranged on a first surface of the substrate 10, and has a plurality of gate finger electrodes 24. The source electrode S is arranged on the first surface of the substrate 10, and has a plurality of source finger electrodes 20. The source finger electrode 20 is close to the gate finger electrode 24. The drain electrode D is arranged on the first surface of the substrate 10, and has a plurality of drain finger electrodes 22. The drain finger electrode 22 faces the source finger electrode 24 via the gate finger electrode 24. In a following explanation, the gate finger electrode 24 may be simply called a gate electrode 24, and the source finger electrode 20 may be simply called a source electrode 20, and the drain finger electrode 22 may be simply called a drain electrode 22.

As shown in FIG. 3, the insulating layer 34 is arranged so as to cover the gate electrode 24, the substrate 10 between the gate electrode 24 and the source electrode 20, the substrate 10 between the gate electrode 24 and the drain electrode 22, at least a part of the source electrode 20, and at least a part of the drain electrode 22.

As shown in FIG. 3, the shield plate electrode 30 is arranged via the insulating layer 34 over a first surface of the substrate 10 between the gate electrode 24 and the drain electrode 22, and over the drain electrode 22. The shield plate electrode 30 is short-circuited to the source electrode 20, and shields electrically the gate electrode 24 and the drain electrode 22 from each other.

As shown in FIG. 1, the gate terminal electrodes G1, G2, ... , G6 are arranged on the first surface of the substrate 10. The gate terminal electrodes G1, G2, ... , G6 are connected a plurality of the gate finger electrodes 24, and bundle a plurality of the gate finger electrodes 24. As shown in FIG. 1, the drain terminal electrodes D1, D2, ... , D6 are arranged on the first surface of the substrate 10. The drain terminal electrodes D1, D2, ... , D6 are connected to a plurality of the drain finger electrodes 2 and bundle a plurality of the drain finger electrodes 22.

The slot VIA holes SC, SC11, SC12, SC21, SC22, ... , SC61, SC62, and SC71 are formed in the substrate under the source electrodes 20, respectively, as shown in FIG. 1 to FIG. 4.

A shield plate short circuit line 32 connects the shield plate electrode 30 and the source electrode 20 by air-bridge structure having an air gap GAP, as shown in FIG. 3.

In addition, the shield plate short circuit line 32 may connect the shield plate electrode 30 and the source electrode 20 by an overlay structure via the insulating layer 34, as shown in FIG. 4.

In addition, the semiconductor device 25 concerning the first embodiment is provided with a ground electrode 50 arranged on a second surface opposite to the first surface of the substrate 10 as shown in FIG. 1 to FIG. 4. The source electrodes 20 are connected to the ground electrode 50 via the slot VIA holes SC, SC11, SC12, SC21, SC22, ... , SC61, SC62, and SC71.

In addition, as shown in FIG. 3, the shield plate electrode 30 is separated from the gate electrode 24 by at least a distance WSG longer than a thickness t1 of the insulating layer. By constituting thus, an effect of electric shield between the drain and the gate is increased, and a capacitance Cgd between the gate and the drain is reduced. In addition, since the shield plate electrode 30 can be greatly separated from the gate electrode 24 as compared with a conventional source field plate, an increase in a capacitance Cgs between the gate and the source can be suppressed. Here, the shield plate electrode 30 should be separated from the gate electrode 24 by at least the distance WSG longer than the thickness t1 of the insulating layer. Here, what is necessary is just WSG>0.

In addition, the shield plate electrode 30 covers an upper part of the drain electrode 22 via the insulating layer 34, as shown in FIG. 1 to FIG. 4.

As for the effect of electric shield between the gate and the drain by the shield plate electrode 30, the thinner the thickness t1 of the insulating layer 34 is, the higher the effect is. In the case where the thickness t1 of the insulating layer 34 is relatively thick, the number of the lines of electric force which run the inside of the insulating layer 34 between the gate electrode 24 and the drain electrode 22 increases, and the effect of electric shield between the gate electrode 24 and the drain electrode 22 is reduced. On the other hand, in the case where the thickness t1 of the insulating layer 34 is relatively thin, the number of the line of electric force which run the inside of the insulating layer 34 between the gate electrode 24 and the drain electrode 22 decreases correspondingly to a thinned part of the insulating layer 34, and the effect of electric shield between the gate electrode 24 and the drain electrode 22 increases.

In the semiconductor device 25 concerning the first embodiment, by arranging the shield plate electrode 30 which is short-circuited to the source electrode 20 near the drain electrode 22, the drain and the gate are electrically shielded from each other, the capacitance Cgd between the gate and the drain is decreased, and the increase in the capacitance Cgs between the gate and the source can be suppressed. Accordingly, the concentration of electric field between the gate and the drain can be relaxed without degrading a high-frequency characteristic.

According to the first embodiment, the capacitance Cgd between the gate and the drain can be reduced. As a result, S parameter S12 can be reduced and a semiconductor device of high gain can be obtained.

As shown in FIG. 1, the semiconductor device 25 concerning the first embodiment includes: a semi-insulating substrate 10; the gate electrode G which is arranged on the first surface of semi-insulating 10 and has a plurality of gate finger electrodes 24; the source electrode S which is arranged on the first surface of the semi-insulating substrate 10 and has a plurality of the source finger electrodes 20; the drain electrode D which is arranged on the first surface of the semi-insulating substrate 10 and has a plurality of drain finger electrodes 22; gate terminal electrodes G1, G2, . . . , G6 which are arranged on the first surface of the semi-insulating substrate 10 and bundle a plurality of the gate finger electrodes 24; drain terminal electrodes D1, D2, . . . , D6 which are arranged on the first surface of the semi-insulating substrate 10 and which bundle a plurality of the drain finger electrodes 22; slot VIA holes SC11, SC12, SC21, SC22, . . . , SC61, SC62, and SC71 which are arranged under the source electrodes 20 (S11, S12, S21, S22, . . . , S61, S62, S71) and which are formed in the semi-insulating substrate 10, respectively; and an ground electrode 50 which is arranged on a second surface opposite to the first surface of the semi-insulating substrate 10 and which is connected to the source finger electrodes 20 via the VIA holes SC11, SC12, SC21, SC22, . . . , SC61, SC62, and SC71.

Each of the slot VIA hole SC11, SC12, SC21, SC22, . . . , SC61, SC62, and SC71 includes a barrier metal layer (not shown) formed on an inner wall of a hole and a filling metal layer which is formed on the barrier metal layer and with which the hole is filled up. The source electrodes 20 are connected to the ground electrode 50 via the slot VIA hole SC11, SC12, SC21, SC22, . . . , SC61, SC62, and SC71.

In the semiconductor device concerning the first embodiment, since the shield plate short circuit line 32 overlaps with the gate electrode 24 via the air gap GAP or the insulating layer 34, a line which short-circuits the source electrode 20 and the shield plate electrode 30 can be shortened. For this reason, a short circuit line between the source electrode 20 and the shield plate electrode 30 can be shortened, inductance of the parasitic inductor connected to the source of the FET cell can be reduced, and feedback impedance of each FET cell can be reduced.

The semi-insulating substrate 10 is any one of a GaAs substrate, an SiC substrate, a GaN substrate, a substrate in which an GaN epitaxial layer is formed on the SiC substrate, a substrate in which a hetero-junction epitaxial layer which consists of GaN/AlGaN is formed on the SiC substrate, a sapphire substrate, and a diamond substrate.

In addition, the semiconductor device 25 concerning the first embodiment is provided with any one of a GaAs system HEMT, a GaAs MESFET and a GaN system HEMT. That is, a semiconducting material suitable for high-frequency operations, such as GaN and GaAs, is used especially for the semiconductor device 25 concerning the first embodiment.
(Structure of FET Cell)

Constructional Example 1

Figure 5:
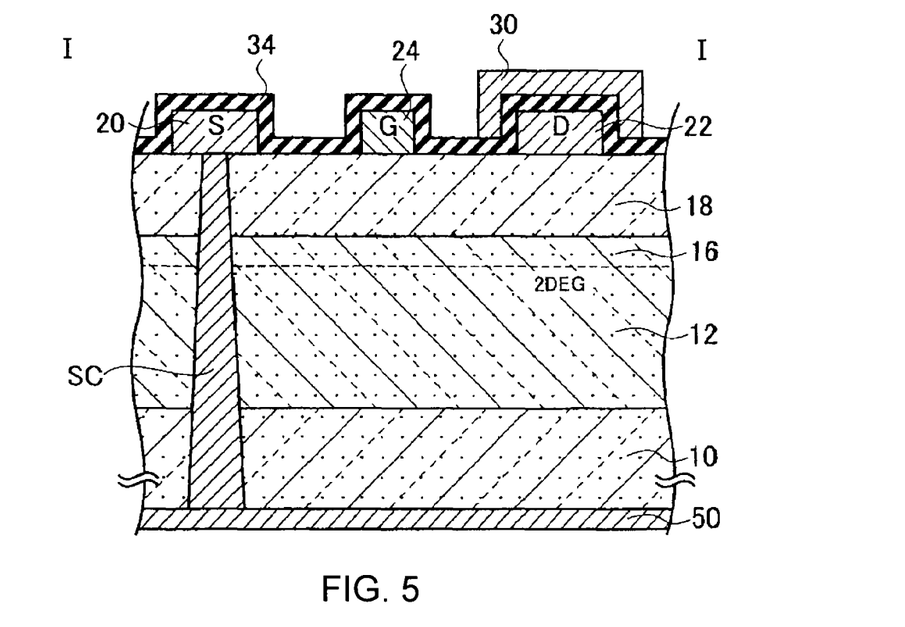
FIG. 5 shows a schematic cross section (constructional example 1 of an FET cell) taken along a I-I line of FIG. 1C.

FIG. 5 shows the constructional example 1 of an FET cell by a schematic cross section taken along the I-I line of FIG. 1C. The FET cell includes: a substrate 10; an epitaxial layer 12 which is arranged on the substrate 10; an electron supplying layer 18 which is arranged on the epitaxial layer 12; a source electrode 20, a gate electrode 24, and a drain electrode 22 which are arranged on the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged over the gate electrode 24 and the electron supplying layer 18 between the gate electrode 24 and the drain electrode 22 via the insulating layer 34, is short-circuited to the source electrode 20, and shields electrically the gate electrode 24 and the drain electrode 22 from each other.

The shield plate electrode 30 is connected to the source electrode 20 like FIG. 3 to FIG. 4 via the shield plate short circuit line 32 of air-bridge structure or overlay structure. The source electrode 20 is connected to a ground electrode 50 via a slot VIA hole SC. In FIG. 5, the shield plate short circuit line 32 is omitted.

A two-dimensional electron gas (2DEG) layer 16 is formed in an interface of the epitaxial layer 12 and the electron supplying layer 18. A high-electron mobility transistor (HEMT) is shown in FIG. 5.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \le y \le 1$), for example. In the case of a GaN system HEMT, the substrate 10 is formed by a GaN substrate or a SiC substrate, the epitaxial layer 12 is formed by a GaN layer, and the electron supplying layer 18 is formed by the aluminum gallium nitride layer ($Al_xGa_{1-x}N$) ($0.1 \le x \le 1$), for example. In the constructional example 1 shown in FIG. 5, the substrate 10, the epitaxial layer 12 and the electron supplying layer 18 correspond to the substrate 10 in FIG. 4 as a whole.

Constructional Example 2

Figure 6:
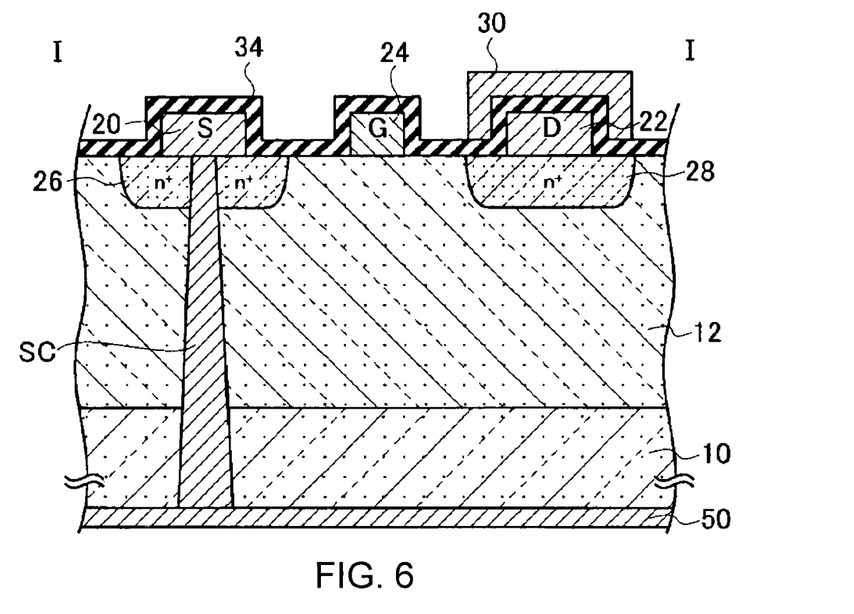
FIG. 6 shows a schematic cross section (constructional example 2 of an FET cell) taken along the I-I line of FIG. 1C.

FIG. 6 shows the constructional example 2 of an FET cell by a schematic cross section taken along the I-I line of FIG. 1C. The FET cell includes: a substrate 10; an epitaxial layer 12 which is arranged on the substrate 10; a source region 26 and a drain region 28 which are arranged in the epitaxial layer 12; a source electrode 20 which is arranged on the source region 26; a gate electrode 24 which is arranged on the epitaxial layer 12; a drain electrode 22 which is arranged on the drain region 28;
an insulating layer 34 which is arranged so as to cover the gate electrode 24, the epitaxial layer 12 between the gate electrode 24 and the source electrode 20, the epitaxial layer 12 between the gate electrode 24 and the drain electrode 22, at least a part of the source electrode 20, and at least a part of the drain electrode 22; and a shield plate electrode 30 which is arranged via the insulating layer 34 over the epitaxial layer 12 between the gate electrode 24 and the drain electrode 22, and the drain electrode 22, is short-circuited to the source electrode 20, and shields electrically the gate electrode 24 and the drain electrode 22 from each other.

The shield plate electrode 30 is connected to the source electrode 20 like FIG. 3 to FIG. 4 via the shield plate short circuit line 32 of air-bridge structure or overlay structure. The source electrode 20 is connected to a ground electrode 50 via a slot VIA hole SC. Also in FIG. 6, the shield plate short circuit line 32 is omitted.

A schottky contact is formed in an interface of the epitaxial layer 12 and the gate electrode 24. The metal-semiconductor field effect transistor (MESFET) is shown in FIG. 6. For example, in the case of GaAs MESFET, the substrate 10 is formed by a GaAs substrate, and the epitaxial layer 12 is formed by an epitaxially grown GaAs layer. The source region 26 and the drain region 28 can be formed by ion implantation, such as Si ion etc. In the constructional example 2 shown in FIG. 5, the substrate 10 and the epitaxial layer 12 correspond to the substrate 10 in FIG. 4 as a whole.

Constructional Example 3

Figure 7:
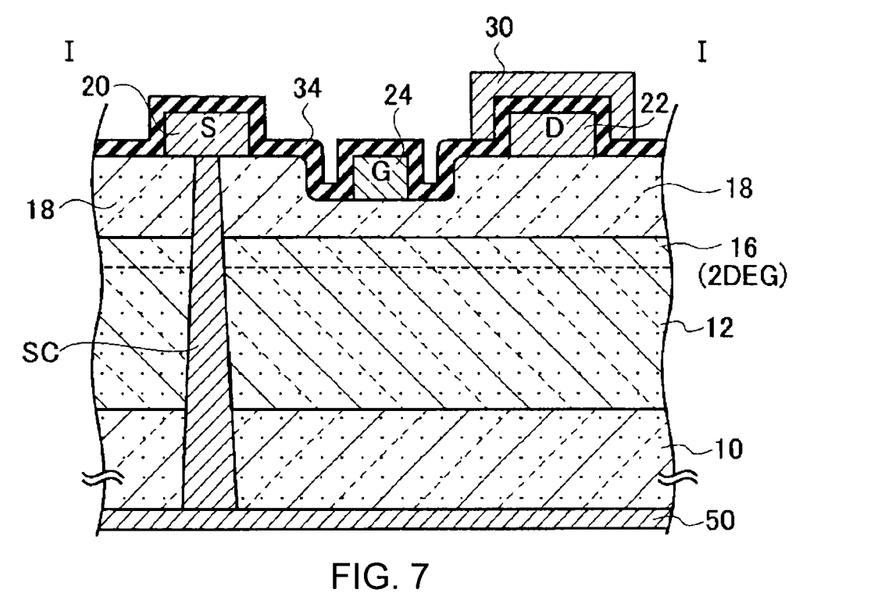
FIG. 7 shows a schematic cross section (constructional example 3 of an FET cell) taken along the I-I line of FIG. 1C.

FIG. 7 shows the constructional example 3 of an FET cell by a schematic cross section taken along the I-I line of FIG.

1C. The FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on a recess part of the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the electron supplying layer 18 between the gate electrode 24 and the drain electrode 22, and the drain electrode 22, is short-circuited to the source electrode 20, and shields electrically the gate electrode 24 and the drain electrode 22 from each other.

The shield plate electrode 30 is connected to the source electrode 20 like FIG. 3 to FIG. 4 via the shield plate short circuit line 32 of air-bridge structure or overlay structure. The source electrode 20 is connected to a ground electrode 50 via a slot VIA hole SC. Also in FIG. 7, the shield plate short circuit line 32 is omitted.

A 2DEG layer 16 is formed in an interface of the epitaxial layer 12 and the electron supplying layer 18. An HEMT is shown in FIG. 7.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In addition, in the case of a GaAs system HEMT, an active layer may be formed by ion implantation of Si ion etc. in the electron supplying layer 18 directly under the gate electrode 24.

In the case of a GaN system HEMT, the substrate 10 is formed by a GaN substrate or a SiC substrate, the epitaxial layer 12 is formed by a GaN layer, and the electron supplying layer 18 is formed by an aluminum gallium nitride layer ($Al_xGa_{1-x}N$) ($0.1 \leq x \leq 1$), for example. In the constructional example 3 shown in FIG. 7, the substrate 10, the epitaxial layer 12 and the electron supplying layer 18 correspond to the substrate 10 in FIG. 4 as a whole.

Constructional Example 4

Figure 8:
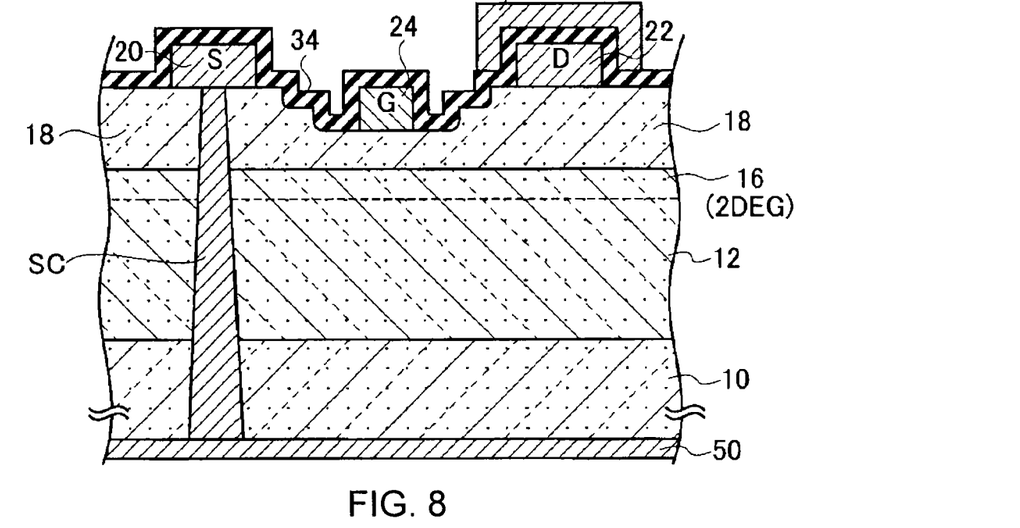
FIG. 8 shows a schematic cross section (constructional example 4 of an FET cell) taken along the I-I line of FIG. 1C.

FIG. 8 shows the constructional example 4 of an FET cell by a schematic cross section taken along the I-I line of FIG. 1C. The FET cell includes: a substrate 10; an epitaxial layer 12 which is arranged on the substrate 10; an electron supplying layer 18 which is arranged on the epitaxial layer 12; a source electrode 20 and a drain electrode 22 which are arranged on the electron supplying layer 18; a gate electrode 24 which is arranged on a two-step recess part of the electron supplying layer 18; an insulating layer 34 which is arranged so as to cover the gate electrode 24, the electron supplying layer 18 between the gate electrode 24 and the source electrode 20, the electron supplying layer 18 between the gate electrode 24 and the drain electrode 22, at least a part of the source electrode 20, and at least a part of the drain electrode 22; and a shield plate electrode 30 which is arranged via the insulating layer 34 over the electron supplying layer 18 between the gate electrode 24 and the drain electrode 22, and the drain electrode 22, is short-circuited to the source electrode 20, and shields electrically the gate electrode 24 and the drain electrode 22 from each other, The shield plate electrode 30 is connected to the source electrode 20 like FIG. 3 to FIG. 4 via a shield plate short circuit wiring 32 of air-bridge structure or overlay structure. The source electrode 20 is connected to a ground electrode 50 via a slot VIA hole SC. Also in FIG. 8, the shield plate short circuit line 32 is omitted.

A 2DEG layer 16 is formed in an interface of the epitaxial layer 12 and the electron supplying layer 18. An HEMT is shown in FIG. 8.

As a specific material, in the case of a GaAs system HEMT, the substrate 10 is formed by a GaAs substrate, the epitaxial layer 12 is formed by a GaAs layer, and the electron supplying layer 18 is formed by an aluminum gallium arsenide layer ($Al_yGa_{1-y}As$) ($0.1 \leq y \leq 1$), for example. In addition, in the case of a GaAs system HEMT, an active layer may be formed by ion implantation of Si ion, etc. in the electron supplying layer 18 directly under the gate electrode 24.

In the case of a GaN system HEMT, the substrate 10 is formed by a GaN substrate or an SiC substrate, the epitaxial layer 12 is formed by a GaN layer, and the electron supplying layer 18 is formed by an aluminum gallium nitride layer ($Al_xGa_{1-x}N$) ($0.1 \leq x \leq 1$), for example. In the constructional example 4 shown in FIG. 8, the substrate 10, the epitaxial layer 12 and the electron supplying layer 18 correspond to the substrate 10 in FIG. 4 as a whole.

In addition, in the semiconductor device 25 concerning the first embodiment, as for the gate electrode 24, a cross-section shape of the gate electrode 24 in a cross section in a direction of a channel between the source and the drain may be formed in T type so that the electric field in the circumference of the gate electrode 24 may be relaxed.

Modification 1

Figure 9:
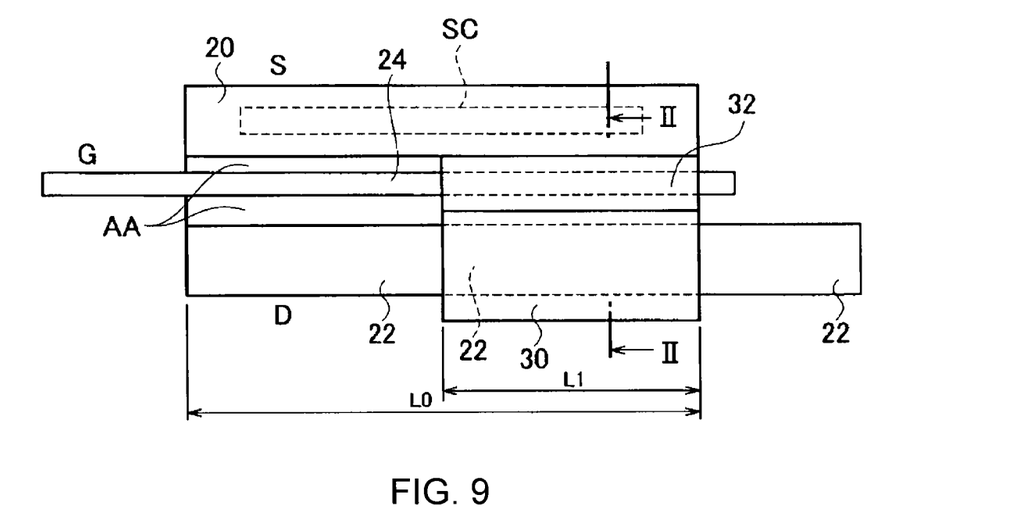
FIG. 9 shows a schematic plane pattern structure of a unit transistor portion in a semiconductor device concerning a modification 1 of the first embodiment.

A schematic plane pattern structure of the semiconductor device 25 concerning the modification 1 of the first embodiment is shown in FIG. 9. A schematic cross section taken along a II-II line of FIG. 9 is similarly shown as FIG. 3.

In the semiconductor device 25 concerning the modification 1 of the first embodiment, a shield plate electrode 30 overlaps with a part of a drain electrode 22. That is, a length L0 of the drain electrode 22 which is in contact with an active region AA, and a length L1 of the shield plate electrode 30 which is arranged on the active region AA, are in a relation of L1<L0.

Here, the active region AA corresponds to an active current conduction region of a substrate 10 between a source electrode 20 and the drain electrode 22. The active region AA also includes each region of the substrate 10 under a gate electrode 24, the source electrode 20, and the drain electrode 22. In addition, the active region AA also includes a region of the substrate 10 between the gate electrode 24 and the source electrode 20 and a region of the substrate 10 between the gate electrode 24 and the drain electrode 22 are also included.

In the semiconductor device 25 concerning the modification 1 of the first embodiment, the shield plate electrode 30 is connected to the source electrode 20 via a shield plate short circuit line 32 of air-bridge structure or overlay structure. A source electrode 20 is connected to a ground electrode 50 via a slot VIA hole SC.

In the semiconductor device concerning the modification 1 of the first embodiment, since the shield plate electrode 30 is arranged so as to overlap with a part of the drain electrode 22, the shield plate electrode 30 can shield electrically the drain and the gate from each other, can reduce a capacitance Cgd between a gate and a drain, and can suppress an increase in a capacitance Cgs between the gate and a source. As a result, according to the modification 1 of the first embodiment, a semiconductor device of high gain can be obtained. Other composition is the same as that of the first embodiment.

Modification 2

Figure 10:
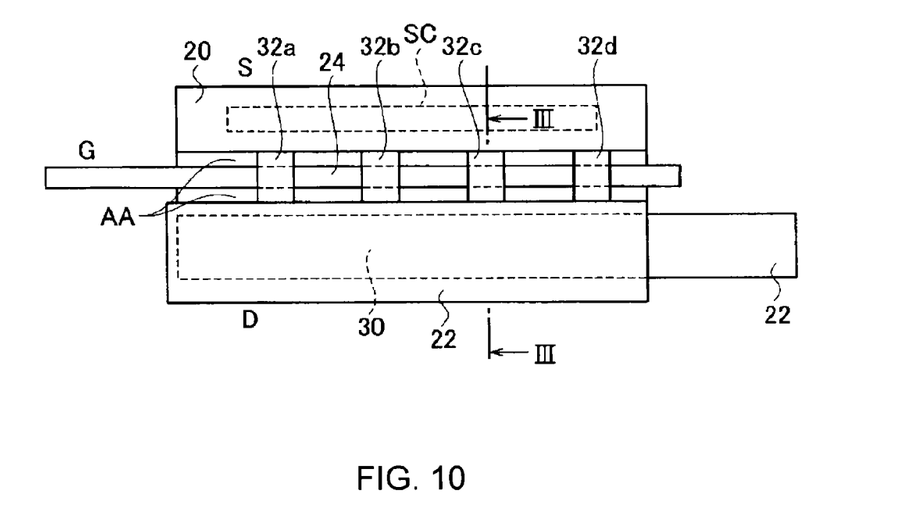
FIG. 10 shows a schematic plane pattern structure of a unit transistor portion in the semiconductor device concerning a modification 2 of the first embodiment.

In a semiconductor device 25 concerning the modification 2 of the first embodiment, a schematic plane pattern structure of a unit transistor portion is shown in FIG. 10. A schematic cross section taken along the III-III line of FIG. 10 is shown in FIG. 11, and another schematic cross section taken along the line of FIG. 10 is shown in FIG. 12.

In the semiconductor device 25 concerning the modification 2 of the first embodiment, shield plate short circuit lines 32a, 32b, 32c and 32d are arranged so that they may overlap with a gate electrode 24.

Figure 11:
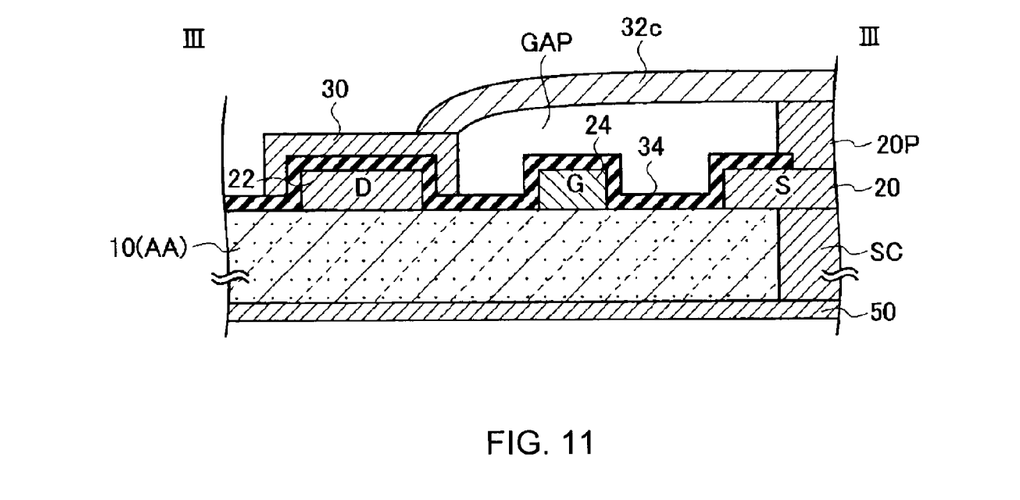
FIG. 11 shows a schematic cross section taken along a line of FIG. 10.
Figure 12:
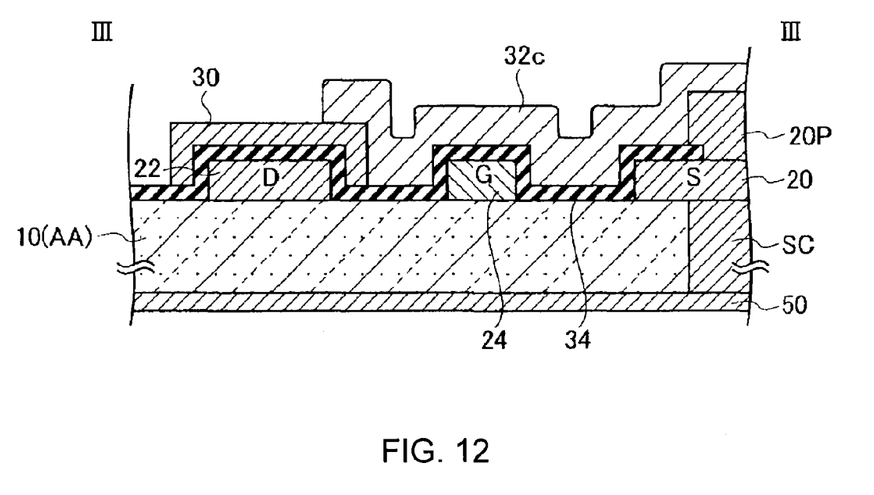
FIG. 12 shows another schematic cross section taken along the III-III line of FIG. 10.

In the example of FIG. 11, the shield plate short circuit lines 32a, 32b, 32c and 32d are arranged over the gate electrode 24 via air gaps GAP. In the example of FIG. 12, each of the shield plate short circuit lines 32a, 32b, 32c and 32d are arranged over the gate electrode 24 via an insulating layer 34.

In the semiconductor device 25 concerning the modification 2 of the first embodiment, the shield plate electrode 30 is connected to the source electrode 20 via the shield plate short circuit lines 32a, 32b, 32c and 32d of air-bridge structure or overlay structure. A source electrode 20 is connected to a ground electrode 50 via a slot VIA hole SC.

In the semiconductor device concerning the modification 2 of the first embodiment, since the shield plate short circuit lines 32a, 32b, 32c and 32d overlap with the gate electrode 24 via the air gaps GAP or the insulating layer 34, a line which short-circuits the source electrode 20 and the shield plate electrode 30 can be shortened.

For this reason, inductance of a parasitic inductor connected to the sauce of the FET cell can be reduced, and feedback impedance of each FET cell can be reduced.

In the semiconductor device 25 concerning the modification 2 of the first embodiment, a drain and a gate can be electrically shielded from each other, a capacitance Cgd between the gate and the drain can be reduced, and an increase in a capacitance Cgs between the gate and the source can be suppressed. Accordingly, the concentration of electric field between the gate and the drain can be relaxed without degrading a high-frequency characteristic.

In the semiconductor device 25 concerning the modification 2 of the first embodiment, since the capacitance Cgd between the gate and the drain can be reduced, S parameter S12 can be reduced and a semiconductor device of high gain can be obtained. Other composition is the same as that of the first embodiment.

Second Embodiment

Semiconductor Device

Figure 13:
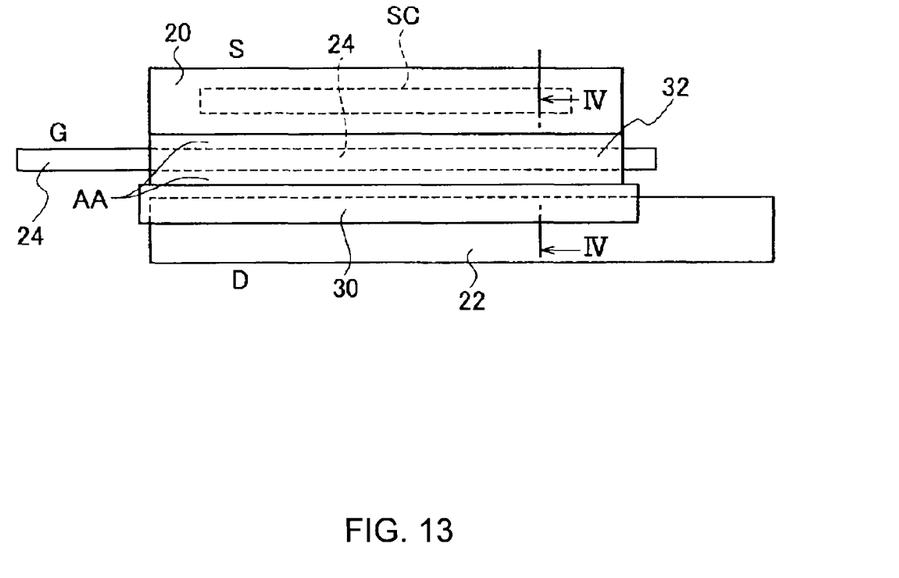
FIG. 13 shows a schematic plane pattern structure of a unit transistor portion in a semiconductor device concerning a second embodiment.
Figure 14:
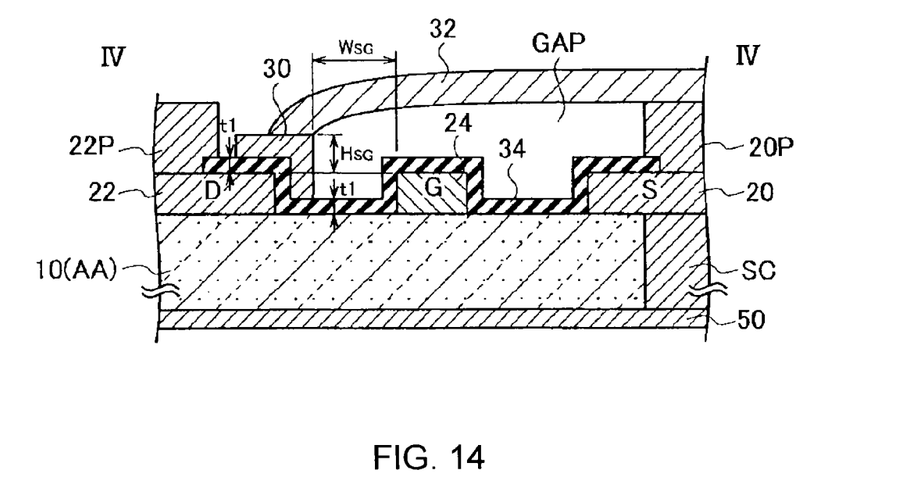
FIG. 14 shows a schematic cross section taken along a IV-IV line of FIG. 13.

A schematic plane pattern structure of a semiconductor device 25 concerning a second embodiment is similarly shown in FIG. 1A. In the semiconductor device 25 concerning the second embodiment, the schematic plane pattern structure of a unit transistor portion is shown in FIG. 13, and the schematic cross section taken along the IV-IV line of FIG. 13 is shown in FIG. 14. Also in FIG. 1A, the shield plate electrode 30 and the shield plate short circuit line 32 as shown in FIG. 13 are arranged at each unit transistor portion like FIG. 13.

As shown in FIG. 13 to FIG. 14, the semiconductor device 25 concerning the second embodiment is provided with a substrate 10, a gate electrode 24, a source electrode 20, and a drain electrode 22, an insulating layer 34, a shield plate electrode 30, and gate terminal electrodes G1, G2, ..., G6 and drain terminal electrodes D1, D2, ... and D6, a slot VIA hole SC and a shield plate short circuit line 32.

A gate electrode G is arranged on a first surface of the substrate 10, and has a plurality of gate finger electrodes 24. A source electrode S is arranged on the first surface of the substrate 10, and has a plurality of source finger electrodes 20. The source finger electrode 20 is arranged next to the gate finger electrode 24. A drain electrode D has a plurality of drain finger electrodes 22. The drain finger electrode 22 is arranged so as to face the source finger electrode 20 via the gate finger electrode 24.

As shown in FIG. 14, the insulating layer 34 is arranged so as to cover the gate electrode 24, the substrate 10 between the gate electrode 24 and the source electrode 20, the substrate 10 between the gate electrode 24 and the drain electrode 22, at least a part of the source electrode 20, and at least a part of the drain electrode 22.

As shown in FIG. 13 to FIG. 14, the shield plate electrode 30 is arranged via the insulating layer 34 over the first surface of the substrate 10 between the gate electrode 24 and the drain electrode 22, and the drain electrode 22, is short-circuited to the source electrode 20, and shields electrically the gate electrode 24 and the drain electrode 22 from each other.

The gate terminal electrodes G1, G2, ..., G6 are arranged on the first surface of substrate 10, and bundle a plurality of the gate finger electrodes 24. The drain terminal electrodes D1, D2, ..., D6 are arranged on the first surface of the substrate 10, and bundle a plurality of the drain finger electrodes 22.

The slot VIA hole SC is arranged under the source electrode 20 and is formed in the substrate 10.

The shield plate short circuit line 32 connects the shield plate electrode 30 and the source electrode 20 by air-bridge structure having air gap GAP, as shown in FIG. 13 to FIG. 14.

In addition, the shield plate short circuit line 32 may connect the shield plate electrode 30 and the source electrode 20 by overlay structure via the insulating layer 34 like FIG. 4.

Furthermore, the semiconductor device 25 concerning the second embodiment is provided with the ground electrode 50 which is arranged on a second surface opposite to the first surface of the substrate 10. The source electrode 20 is connected to the ground electrode 50 via the slot VIA hole SC.

As shown in FIG. 14, the shield plate electrode 30 is arranged so that the shield plate electrode 30 may be separate from the gate electrode 24 by at least only a distance WSG longer than a thickness t1 of the insulating layer. By constituting thus, effect of electric shield between a drain and a gate is increased, a capacitance Cgd between the gate and the drain is reduced, and an increase in a capacitance Cgs between the gate and a source can be suppressed. Here, the shield plate electrode 30 should be separated from the gate electrode 24 by at least the distance WSG longer than the thickness t1 of the insulating layer. Here, what is necessary is just WSG>0.

The shield plate electrode 30 covers at least a part of upper part of the drain electrode 22 via the insulating layer 34, as shown in FIG. 13-FIG. 14.

As shown in FIG. 14, a drain pad electrode 22P may be arranged on the drain electrode 22, and a source pad electrode 20P may be arranged on the source electrode 20. The resistance ingredient of the drain electrode D and the source electrode S which have finger structure, respectively can be reduced by the drain pad electrode 22P and the source pad electrode 20P.

As for the effect of electric shield between the gate and the drain by the shield plate electrode 30, the thinner the thickness t1 of the insulating layer 34 is, the higher the effect is. In the case where the thickness t1 of the insulating layer 34 is relatively thin, the number of the line of electric force which run the inside of the insulating layer 34 between the gate electrode 24 and the drain electrode 22 decreases correspondingly to a thinned part of the insulating layer 34, and the effect of electric shield between the gate electrode 24 and the drain electrode 22 increases.

Furthermore, as shown in FIG. 14, in the semiconductor device 25 concerning the second embodiment, an upper end of the shield plate electrode 30 measured from the first surface of the substrate 10 is higher than an upper end of the gate electrode 24 measured from the first surface of the substrate 10 by only a height HSG. By constituting thus, the effect of electric shield between the drain and the gate can be increased.

In the semiconductor device 25 concerning the second embodiment, by arranging the shield plate electrode 30 which is short-circuited to the source electrode 20 near the drain electrode 22, the drain and the gate are electrically shielded from each other, a capacitance Cgd between the gate and the drain is decreased, and an increase in a capacitance Cgs between the gate and the source can be suppressed. Accordingly, the concentration of electric field between the gate and the drain can be relaxed without degrading a high-frequency characteristic.

The capacitance Cgd between the gate and the drain can be reduced in the semiconductor device 25 concerning the second embodiment. As a result, S parameter S12 can be reduced and a semiconductor device of high gain can be obtained. Other composition is the same as that of the first embodiment.

Modification 1

Figure 15:
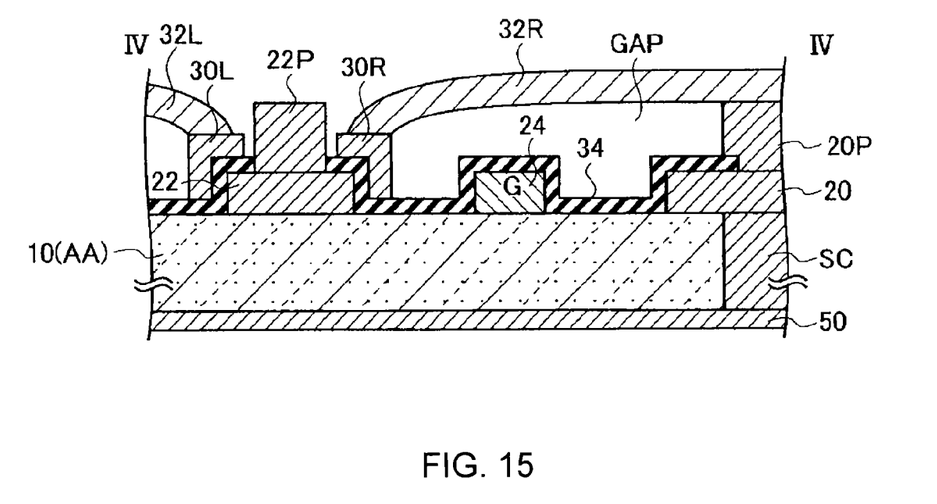
FIG. 15 shows a schematic cross section of the semiconductor device concerning a modification 1 of the second embodiment.

A schematic cross section of a semiconductor device concerning the modification 1 of the second embodiment is shown in FIG. 15.

In the semiconductor device concerning the modification 1 of the second embodiment, shield plate electrodes 30R and 30L sandwich a drain electrode 22 from both sides via an insulating layer 34 arranged on the drain electrode 22, as shown in FIG. 15.

A shield plate short circuit line 32R connects the shield plate electrode 30 and a source electrode 20 by air-bridge structure having air gap GAP, as shown in FIG. 15.

The shield plate short circuit line 32R may connect the shield plate electrode 30 and the source electrode 20 by overlay structure via the insulating layer 34 like FIG. 4.

In addition, the semiconductor device 25 concerning the modification 1 of the second embodiment is provided with a ground electrode 50 which is arranged on a second surface opposite to the first surface of the substrate 10.

The source electrode 20 is connected to the ground electrode 50 via the slot VIA hole SC.

In the semiconductor device 25 concerning the modification 1 of the second embodiment, a left-hand side shield plate electrode 30L is connected to a shield plate short circuit line 32L as well as a right-hand side shield plate electrode 30R in FIG. 15. Furthermore, the shield plate short circuit line 32L is connected to the source electrode 20 which is arranged on left-hand side of the drain electrode 22, and the shield plate short circuit line 32L of the overlay structure via the air-bridge structure which has air gap GAP or the insulating layer 34.

In the semiconductor device concerning the modification 1 of the second embodiment, the shield plate electrode 30 overlaps with a part of the drain electrode 22.

Accordingly, the drain and the gate are shielded electrically from each other, and the capacitance Cgd between the gate and the drain can be reduced. And furthermore the increase in the capacitance Cgs between the gate and the source can be suppressed. As a result, according to the modification 1 of the second embodiment, the semiconductor device of high gain can be obtained. Other composition is the same as that of second embodiment.

Modification 2

Figure 16:
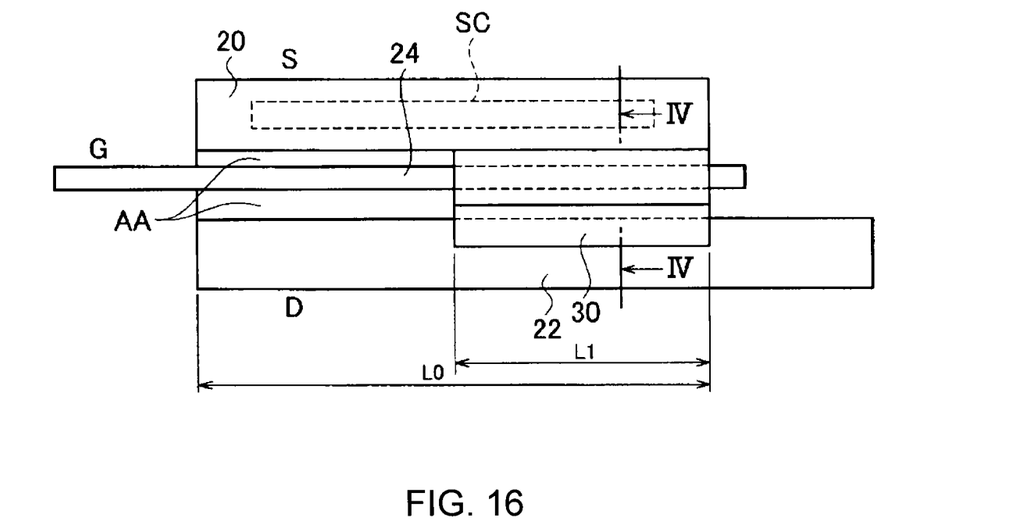
FIG. 16 shows a schematic plane pattern structure of a unit transistor portion in a semiconductor device concerning a modification 2 of the second embodiment.

A schematic plane pattern structure of a semiconductor device concerning a modification 2 of the second embodiment is shown in FIG. 16. In the semiconductor device concerning the modification 2 of the second embodiment, a shield plate electrode 30 overlaps with a part of a drain electrode 22. That is, a length L0 of the drain electrode 22 which is in contact with an active region AA, and a length L1 of the shield plate electrode 30 which is arranged on the active region AA, are in a relation of L1<L0.

In the semiconductor device 25 concerning the modification 2 of the second embodiment, the shield plate electrode 30 is connected to a source electrode 20 via a shield plate short circuit line 32 of air-bridge structure or overlay structure. The source electrode 20 is connected to a ground electrode 50 via a slot VIA hole SC.

In FIG. 16, a schematic cross section taken along an IV-IV line is the same as that of FIG. 14.

In the semiconductor device concerning the modification 2 of the second embodiment, the shield plate electrode 30 overlaps with a part of the drain electrode 22. For this reason, the shield plate electrode 30 shields between a drain and a gate electrically from each other, reduces a capacitance Cgd between a gate and a drain, and can suppress an increase in a capacitance Cgs between the gate and the source. As a result, according to the modification 2 of the second embodiment, the semiconductor device of high gain can be obtained. Other composition is the same as that of second embodiment.

Modification 3

Figure 17:
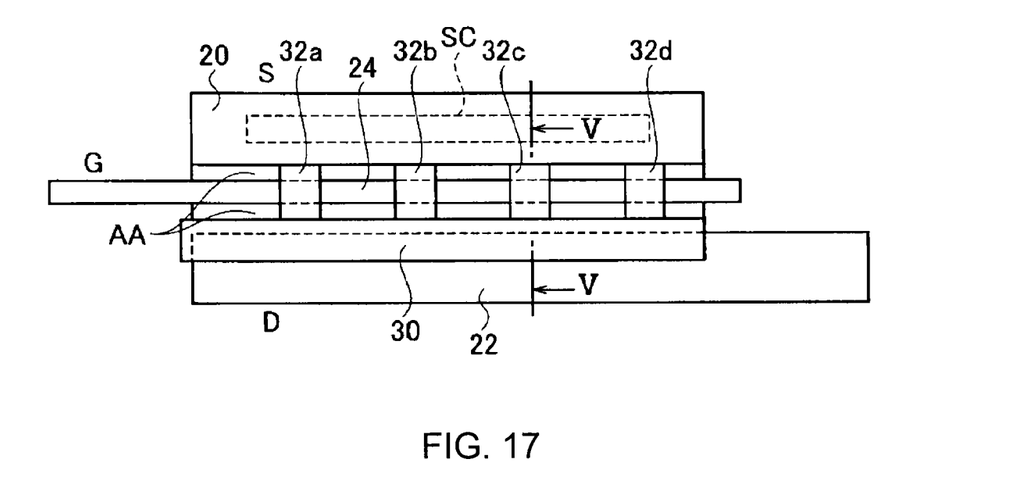
FIG. 17 shows a schematic plane pattern structure of a unit transistor portion in the semiconductor device concerning a modification 3 of the second embodiment.

A schematic plane pattern structure of a high-frequency semiconductor device concerning the modification 3 of the second embodiment is shown in FIG. 17. A schematic cross section taken along the V-V line of FIG. 17 is shown in FIG. 18, and another schematic cross section taken along the V-V line of FIG. 17 is shown in FIG. 19.

In the semiconductor device concerning the modification 3 of the second embodiment, the shield plate short circuit lines 32a, 32b, and 32c. 32d overlap with the gate electrode 24.

Figure 18:
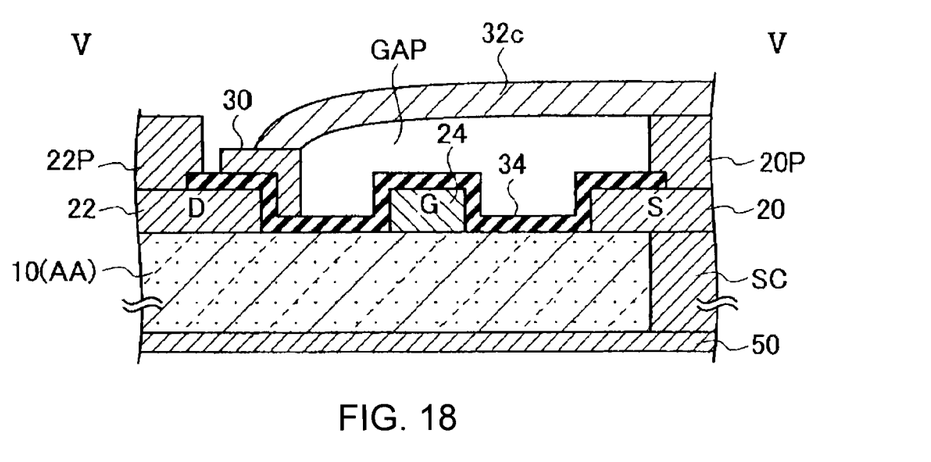
FIG. 18 shows a schematic cross section taken along a V-V line of FIG. 17.
Figure 19:
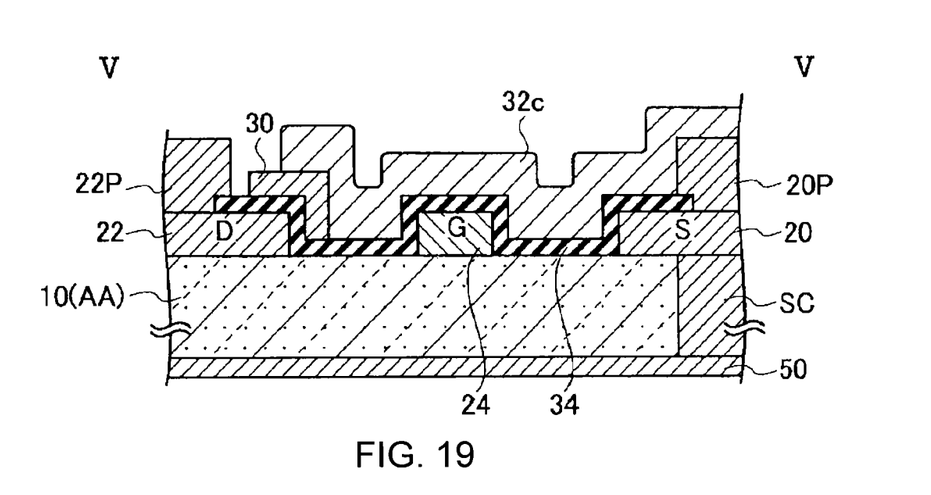
FIG. 19 shows another schematic cross section taken along a line of FIG. 17.

In the example of FIG. 18, shield plate short circuit lines 32a, 32b, 32c and 32d are arranged via air gap GAP over a gate electrode 24. In the example of FIG. 19, shield plate short circuit lines 32a, 32b, 32c and 32d are arranged via an insulating layer 34 over a gate electrode 24.

In the semiconductor device 25 concerning the modification 3 of the second embodiment, the shield plate electrode 30 is connected to a source electrode 20 via the shield plate short circuit lines 32a, 32b, 32c and 32d of air-bridge structure or overlay structure. The source electrode 20 is connected to a ground electrode 50 via a slot VIA hole SC.

In the semiconductor device concerning the modification 3 of the second embodiment, since the shield plate short circuit lines 32a, 32b, 32c and 32d overlap with the gate electrode 24 via air gap GAP or insulating layer 34, a line which short-circuits the source electrode 20 and the shield plate electrode 30 can be shortened. For this reason, inductance of a parasitic inductor connected to a sauce of a FET cell can be reduced, and feedback impedance of each FET cell can be reduced.

As for the semiconductor device concerning the modification 3 of the second embodiment, a drain and a gate are shielded electrically from each other, a capacitance Cgd between the gate and the drain is reduced, and an increase in a capacitance Cgs between the gate and the source can be suppressed. Accordingly, the concentration of electric field between the gate and the drain can be relaxed without degrading a high-frequency characteristic.

In the semiconductor device 25 concerning the modification 3 of the second embodiment, since the capacitance Cgd between the gate and the drain can be reduced, S parameter S12 can be reduced and a semiconductor device of high gain can be obtained. Other composition is the same as that of second embodiment.

As explained above, according to this embodiment, a semiconductor device of high gain can be provided.

Other Embodiments

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

As for a semiconductor chip carried in the semiconductor device concerning the embodiments, not only a FET and a HEMT but an amplification element, such as an LDMOS (Laterally Diffused Metal-Oxide-Semiconductor Field Effect Transistor), an HBT (Hetero-junction Bipolar Transistor), etc. can be used.

What is claimed is:

1. A semiconductor device, comprising:
a substrate;
a gate electrode which is arranged on a first surface of the substrate and has a plurality of gate finger electrodes;
a source electrode which is arranged on the first surface of the substrate and has a plurality of source finger electrodes, the source finger electrode is close to the gate finger electrode;
a drain electrode which is arranged on the first surface of the substrate and has a plurality of drain finger electrodes, the drain finger electrode faces the source finger electrode via the gate finger electrode;
an insulating layer which covers the gate finger electrode, the substrate between the gate finger electrode and the source finger electrode, the substrate between the gate finger electrode and the drain finger electrode, at least a part of the source finger electrode, and at least a part of the drain finger electrode;
a shield plate electrode which is arranged via the insulating layer over the drain finger electrode and the first surface of the substrate between the gate finger electrode and the drain finger electrode, is short-circuited to the source finger electrode, and shields electrically the gate finger electrode and the drain finger electrode from each other;
a gate terminal electrode which is arranged on the first surface of the substrate and is connected to a plurality of the gate finger electrodes;
a drain terminal electrode which is arranged on the first surface of the substrate and is connected to a plurality of the drain finger electrodes;
a slot VIA hole which is formed in the substrate under the source finger electrode and is connected to the source finger electrode; and
a shield plate short circuit line which connects the shield plate electrode and the source finger electrode.

2. The semiconductor device according to the claim 1, wherein the shield plate electrode is separated from the gate finger electrode by at least only a distance longer than a thickness of the insulating layer.

3. The semiconductor device according to the claim 1, wherein the shield plate electrode covers at least a part of an upper part of the drain finger electrode via the insulating layer.

4. The semiconductor device according to the claim 1, wherein the shield plate short circuit line overlaps over the gate finger electrode.

5. The semiconductor device according to the claim 4, wherein the shield plate short circuit line of overlay structure is arranged over the gate finger electrode via the insulating layer.

6. The semiconductor device according to the claim 4, wherein the shield plate short circuit line of air-bridge structure is arranged over the gate finger electrode via an air gap.

7. The semiconductor device according to the claim 4, wherein an upper end of the shield plate electrode measured from the first surface of the substrate is higher than an upper end of the gate finger electrode.

8. The semiconductor device according to the claim 4, wherein the substrate is any one of a GaAs substrate, an SiC substrate, a GaN substrate, a substrate in which a GaN epitaxial layer is formed on the SiC substrate, a substrate in which a hetero-junction epitaxial layer which consists of GaN/AlGaN is formed on the SiC substrate, a sapphire substrate and a diamond substrate.

9. The semiconductor device according to the claim 1, further comprising a ground electrode which is arranged on a second surface opposite to the first surface of the substrate, and is connected to the source finger electrode via the slot VIA hole.

10. The semiconductor device according to the claim 1, wherein the semiconductor device is provided with a GaAs systems HEMT, a GaAs MESFET and a GaN system HEMT.

* * * * *